(12) United States Patent
Li et al.

(10) Patent No.: US 7,696,085 B2
(45) Date of Patent: Apr. 13, 2010

(54) DUAL DAMASCENE METAL INTERCONNECT STRUCTURE HAVING A SELF-ALIGNED VIA

(75) Inventors: Wai-kin Li, Beacon, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/034,122

(22) Filed: Feb. 20, 2008

(65) Prior Publication Data

US 2009/0206489 A1    Aug. 20, 2009

(51) Int. Cl.
*H01L 21/4763* (2006.01)
(52) U.S. Cl. ............... 438/626; 438/637; 438/697; 438/700; 257/E21.219; 257/E21.295
(58) Field of Classification Search ......... 438/626, 438/637, 697, 700; 257/E21.219, E21.295
See application file for complete search history.

(56) References Cited

U.S. PATENT DOCUMENTS

2008/0085601 A1* 4/2008 Park et al. ............... 438/637
2008/0257187 A1* 10/2008 Millward .................. 101/452

OTHER PUBLICATIONS

Nealey et al., "Self-assembling resists for nanolithography", IEDM Technical Digest, Dec. 2005, Digital Object Identifier 10.1109/IEDM.2005.1609349.

* cited by examiner

*Primary Examiner*—Alexander G Ghyka
*Assistant Examiner*—Abdulfattah Mustapha
(74) *Attorney, Agent, or Firm*—Scully, Scott, Murphy & Presser, P.C.; Katherine S. Brown, Esq.

(57) ABSTRACT

A recessed region containing a line portion and a bulge portion is formed in a hard mask layer. Self-assembling block copolymers containing two or more different polymeric block components that are immiscible with one another are applied within the recessed region and annealed. A cylindrical polymeric block centered at the bulge portion is removed selective to a polymeric block matrix surrounding the cylindrical polymeric block. A via cavity is formed by transferring the cavity formed by removal of the cylindrical polymeric block into a dielectric layer. The pattern in the hard mask layer is subsequently transferred into the dielectric layer to form a line cavity. A metal via and a metal line are formed by deposition and planarization of metal. The metal via is self-aligned to the metal line.

13 Claims, 9 Drawing Sheets

DUAL DAMASCENE METAL INTERCONNECT STRUCTURE HAVING A SELF-ALIGNED VIA

FIELD OF THE INVENTION

The present invention relates to a semiconductor structure, and particularly to a dual damascene metal interconnect structure having a self-aligned via and methods of manufacturing the same.

BACKGROUND OF THE INVENTION

A dual damascene integration scheme is a process integration scheme employed in semiconductor manufacturing to form metal vias and metal lines with a single metal fill process and a single metal planarization process. Two lithographic masks are employed to pattern via holes and metal line cavities separately in a conventional dual damascene integration scheme. Variations in the conventional dual damascene integration scheme includes a via first dual damascene integration scheme, in which via cavities are formed prior to patterning of line cavities, and a line first dual damascene integration scheme, in which line cavities are formed prior to patterning of via cavities. The via cavities and the line cavities formed in a dielectric layer are filled by the metal fill process at the same time. Upon planarization of the metal layer, metal vias filling the via cavities and metal lines filling the line cavities are simultaneously formed.

Since the line cavities and the via cavities are formed in separate lithographic processes, it is necessary to control the overlay between the pattern for the via cavities and the pattern for the line cavities. For high performance semiconductor chips employing high density semiconductor devices and high density metal wiring, critical masks, i.e., lithographic masks having the smallest possible overlay tolerance in alignment with another level during the lithographic imaging process, need to be employed for patterning the via cavities and the line cavities to insure that sufficient overlap is present between the resulting metal vias and metal lines. Use of such critical masks increases manufacturing cost significantly since lithographic processing steps, and especially critical level lithographic processing steps, require expensive state-of-the-art lithographic equipment.

Further, even with such state-of-the-art lithographic equipment, overlay variations between two lithographic images are necessarily finite. With continual reduction in feature size and the limited capabilities of lithographic tools to scale overlay tolerance with the scaling of feature sizes of metal lines and metal vias, the overlay variations between the image of via cavities and line cavities may statistically result in a significant reduction in contact area between metal vias and metal lines and adversely affect yield, performance, and/or reliability of the metal interconnect structure.

In view of the above, there exists a need to provide a metal interconnect structure that may be manufactured with reduced processing cost through reduction in the number of lithographic steps employed to pattern via cavities and line cavities.

Further, there exists a need for a metal interconnect structure in which the overlay variation between a via cavity and a line cavity is reduced or eliminated so that yield, performance, and/or reliability of the metal interconnect structure is enhanced, and methods of manufacturing the same.

SUMMARY OF THE INVENTION

The present invention addresses the needs described above by providing a metal interconnect structure in which a metal via is self aligned to a metal line, i.e., the center of a metal via is self-aligned to a predefined position within the metal line, and methods of manufacturing the same.

In the present invention, a recessed region containing a line portion and a bulge portion is formed in a hard mask layer. The line portion has a first width, which may be close to a lithographic minimum dimension, and the bulge portion has a second width, which is greater than the first width. Self-assembling block copolymers containing two or more different polymeric block components that are immiscible with one another are applied within the recessed region and annealed. A cylindrical polymeric block in the form of an elliptical cylinder and containing a first polymeric block component and a polymeric block matrix containing a second polymeric block component are formed within the recessed region. The cylindrical polymeric block is self-aligned to the center of the bulge portion. The diameter of the cylindrical polymeric block may have a sublithographic dimension. The cylindrical polymeric block is removed selective to the polymeric block matrix to form a cylindrical cavity.

The pattern of the cylindrical cavity is transferred into a dielectric layer underneath to form a via cavity. The polymeric block matrix is removed selective to the hard mask layer. The pattern in the hard mask layer is transferred into the dielectric layer to form a line cavity, while the via cavity is deepened to expose an underlying conductive structure. By filling the via cavity and the line cavity with metal and planarizing the metal, a metal via and a metal line are formed. The metal via is self-aligned to the metal line. Therefore, overlay between the metal via and the metal line is zero enhancing yield, performance, and reliability of the metal interconnect structure. Further, the metal line and the metal via are formed with one lithographic step, thereby reducing manufacturing costs.

According to an aspect of the present invention, a method of forming a metal interconnect structure is provided, which comprises:

forming a hard mask layer over a dielectric layer;

patterning the hard mask layer to form a recessed region comprising a first portion and a second portion, wherein the first portion has a first width and the second portion has a second width, and wherein the second width is greater than the first width;

applying self-assembling block copolymers within the recessed region;

annealing the self-assembling block copolymers and inducing formation of a cylindrical polymeric block and a polymeric block matrix surrounding the cylindrical polymeric block;

removing the cylindrical polymeric block selective to the polymeric block matrix; and forming a via cavity in the dielectric layer by etching the dielectric layer employing the polymeric block matrix as an etch mask.

In one embodiment, the self-assembling block copolymers contains a first polymeric block component and a second polymeric block component that are immiscible with each other.

In another embodiment, the cylindrical polymeric block comprising the first polymeric block component and the polymeric block matrix comprises the second polymeric block component.

In even another embodiment, the self-assembling block copolymers comprises at least one of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

In yet another embodiment, the method further comprises forming a line cavity in the dielectric layer by transferring a pattern of the recessed region into the dielectric layer.

In still another embodiment, the line cavity is formed by an etch that removes the dielectric layer employing the hard mask layer as an etch mask.

In still yet another embodiment, the method further comprises deepening the via cavity during the formation of the line cavity, wherein a conductive structure is exposed at a bottom of the via cavity after the deepening of the via cavity.

In a further embodiment, the method further comprises:
depositing metal in the via cavity and the line cavity; and
planarizing the metal, wherein a remaining portion of the metal in the via cavity constitutes a metal via and a remaining portion of the metal in the line cavity constitutes a metal line.

In an even further embodiment, the via cavity is self-aligned to a center of the second portion.

In a yet further embodiment, the via cavity has a form of an elliptical cylinder.

In a still further embodiment, the first width is a lithographic dimension, and wherein a minor diameter of the elliptical cylinder is a sublithographic dimension.

In a still yet further embodiment, a major diameter of the elliptical cylinder is a sublithographic dimension.

In further another embodiment, the method further comprises forming a dielectric oxide layer directly on the dielectric layer, and the hard mask layer is formed directly on the dielectric oxide layer and comprises silicon nitride.

According to another aspect of the present invention, a metal interconnect structure is provided, which comprises:
a dielectric layer located on a substrate;
a metal line embedded in the dielectric layer and having a first portion with a first width and a second portion having a second width, wherein the second width is greater than the first width; and
a metal via of integral construction with the metal line and embedded in the dielectric layer and vertically abutting a bottom surface of the second portion, wherein a center of a horizontal cross-sectional area of the metal via is self-aligned to a geometrical center of the second portion.

In one embodiment, the first width is a lithographic dimension.

In another embodiment, the second portion has a substantially rectangular horizontal cross-sectional area.

In even another embodiment, the metal via has an elliptical cross-sectional area.

In yet another embodiment, a minor diameter of the elliptical cross-sectional area is sublithographic.

In still another embodiment, a major diameter of the elliptical cross-sectional area is sublithographic.

In still yet another embodiment, the method further comprises a dielectric oxide layer located directly on the dielectric layer, wherein a top surface of the dielectric oxide layer is coplanar with a top surface of the metal line.

In a further embodiment, the dielectric layer has a dielectric constant less than 3.0, and the metal via contacts a conductive structure underneath.

In an even further embodiment, an entire bottom surface of the first portion does not abut any metal via.

BRIEF DESCRIPTION OF THE DRAWINGS

FIGS. 1A-9B are sequential views of an exemplary metal interconnect structure according to the present invention. Figures with the same numeric label correspond to the same stage of manufacturing. Figures with the suffix "A" are top-down views, and figures with the suffix "B" are vertical cross-sectional views along the plane B-B' of the corresponding figure with the same numeric label and the suffix "A.

DETAILED DESCRIPTION OF THE INVENTION

Figure 1A:
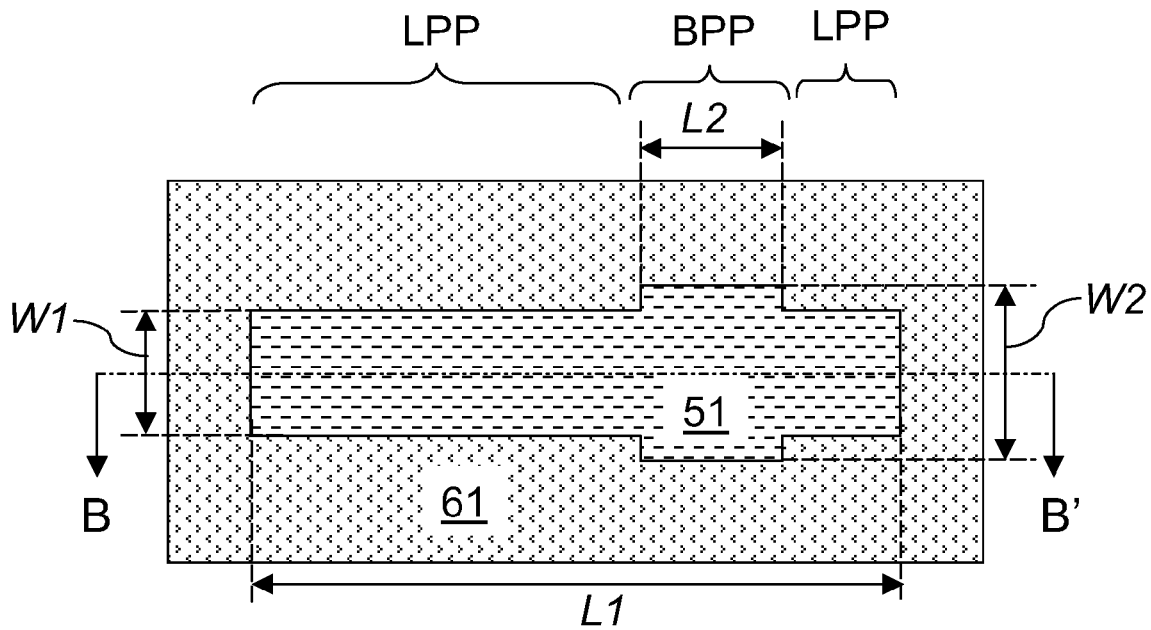

As stated above, the present invention relates to a dual damascene metal interconnect structure having a self-aligned via and methods of manufacturing the same, which are now described in detail with accompanying figures. The method employs self-assembly copolymers, and the self-aligned via may have sublithographic lateral dimensions. It is noted that like and corresponding elements are referred to by like reference numerals.

Figure 1B:
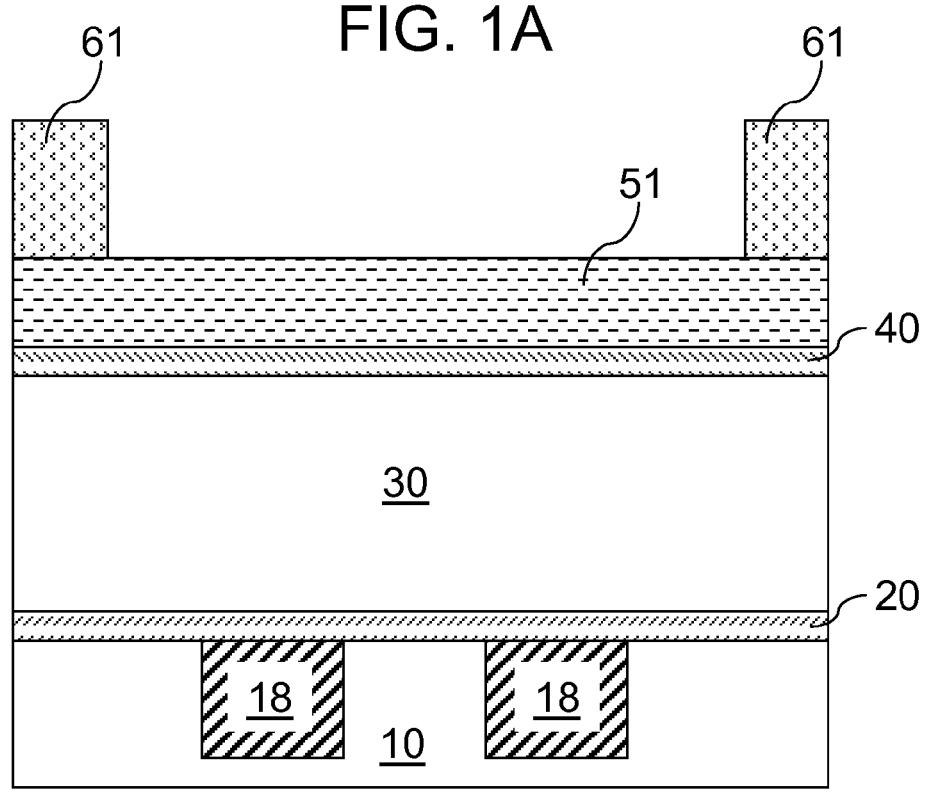

Referring to FIGS. 1A and 1B, an exemplary metal interconnect structure according to the present invention is shown, which comprises an underlying dielectric layer 10, underlying conductive structures 18 embedded in the underlying dielectric layer 10, a dielectric cap layer 20 formed on and over the top surfaces of the underlying dielectric layer 10 and the underlying metal lines 18, a stack, from bottom to top, of a dielectric layer 30, a planarization stopping layer 40, and a hard mask layer 51 formed on the dielectric cap layer 20, and a photoresist 61 applied to, and patterned over, the hard mask layer 51.

The underlying dielectric layer 10 and the dielectric layer 30 comprises a dielectric material, which may be a silicon oxide based dielectric material or a low dielectric constant (low-k) dielectric material having a dielectric constant of about 3.0 or less. The underlying dielectric cap layer 10 may further comprise an underlying planarization stopping layer (not shown), which may have the same composition as the planarization stopping layer 40, and has a top surface that is substantially coplanar with top surfaces of the underlying conductive structures 18.

Exemplary silicon based dielectric materials include undoped silicate glass (USG), borosilicate glass (BSG), phosphosilicate glass (PSG), borophosphosilicate glass (BPSG), fluorosilicate glass (FSG), etc. Low dielectric constant dielectric materials include organosilicate glass (OSG) and fluorinated or non-fluorinated organic polymer based low k materials such as Dow Chemical's SiLK™ dielectric, Honeywell's Flare™, polyimides, benzocyclobutene, polybenzoxazoles, and aromatic thermosetting polymers based on polyphenylene ethers. The organosilicate glass (OSG) has a silica-like backbone with alkyl or aryl groups attached directly to the Si atoms in the network. Their elemental compositions generally comprise Si, C, O, and H in various ratios. The C and H are most often present in the form of methyl groups (—$CH_3$). The primary function of the methyl groups is to create a free volume in, and reduce the polarizability of, layers of the organosilicates that are formed in a metal interconnect structure. A secondary function of the methyl groups is to add hydrophobicity to the organosilicates. The k value can be further reduced to 2.2 (ultra low k) and even below 2.0 (extreme low k) by introduction of porosity in the layers of the organosilicates. In general, the low dielectric constant dielectric materials may be formed by plasma enhanced chemical vapor deposition (PECVD), a spin-on coating, etc.

The underlying conductive structures 18 may comprise metal lines, metal vias, or any other conductive structure. Typically, the underlying conductive structures 18 comprise a metal such as copper, tungsten, or aluminum. In case the underlying conductive structures comprise metal lines, additional metal vias (not shown) abutting the metal lines may be formed in the underlying dielectric layer 10.

The planarization stopping layer 40 comprises a material that may be employed as a stopping layer during planarization of metal to be subsequently deposited within recessed features of the dielectric layer 30. For example, the planarization stopping layer 40 may be a dielectric oxide layer such as a silicon oxide layer. The thickness of the planarization stopping layer 40 may be from about 5 nm to about 50 nm, and typically from about 10 nm to about 30 nm, although lesser and greater thicknesses are also contemplated. Preferably, the planarization stopping layer 40 is resistive to abrasion during a subsequent planarization process so that the removal of metal self-stops at a surface that is substantially coplanar with a top surface of the planarization stopping layer 40.

The hard mask layer 51 comprises a dielectric material, which is preferably different from the material of the planarization stopping layer 40. The hard mask layer 51 may comprise a dielectric oxide or a dielectric nitride. For example, the hard mask layer 51 comprises silicon nitride. The hard mask layer 51 is formed by blanket deposition such as plasma enhanced chemical vapor deposition (PECVD), high density plasma chemical vapor deposition (HDPCVD), spin-on coating, etc. Thus, the hard mask layer 51 is a continuous blanket film as deposited. The thickness of the hard mask layer 51 may be from about 10 nm to about 500 nm, and typically from about 30 nm to about 200 nm, although lesser and greater thicknesses are also contemplated herein.

The photoresist 61 is applied over the top surface of the hard mask layer 51 and lithographically patterned by methods known in the art. The pattern formed in the photoresist includes a first portion having a first width W1 and a second portion having a second width W2. The first portion is herein referred to as a "line portion" LP and the second portion is herein referred to as a "bulge portion" BP. The pattern may comprise additional bulge portions (not shown), each of which is separated by a segment of the line pattern portion LPP. The line pattern portion LPP may comprise multiple segments, each of which is separated by at least one bulge portion. Preferably, each segment of the line pattern portion LPP has the first width W1, and the bulge pattern portion BPP and each of the additional bulge portions have the second width W2. The bulge pattern portion BPP may have a rectangular area, and each segment of the line pattern portion LPP may have a rectangular area. The total length of the line pattern portion LPP and the bulge pattern portion BP is herein referred to as a first length L1. In case the bulge pattern portion BPP has a rectangular area, the length of the bulge pattern portion BPP, which is measured in the direction perpendicular to the direction of the first width W1 and the second width W2, is herein referred to as a second length L2.

The first width W1, the second width W2, the first length L1, and the second length L2 are lithographic dimensions, i.e., dimensions that may be printed by normal lithographic techniques. The second width W2 is greater than the first width W1, and the bulge pattern portion BPP "bulges out" of the sidewalls of the line pattern portion LPP, hence the name "bulge portion." Preferably, the first width W1 is at, or close to, a "lithographic minimum dimension," which is also called a "critical dimension." While the lithographic minimum dimension, or the critical dimension, is defined only in relation to an available lithography tool, and normally changes from generation to generation of semiconductor technology, it is understood that the lithographic minimum dimension and the critical dimension are to be defined in relation to the best performance of lithography tools available at the time of semiconductor manufacturing. As of 2008, the lithographic minimum dimension is about 50 nm and is expected to shrink in the future. Any dimension less than the lithographic minimum dimension is called a "sublithographic dimension." Preferably, the second length L2 is also at, or close to, the lithographic minimum dimension.

Figure 2A:
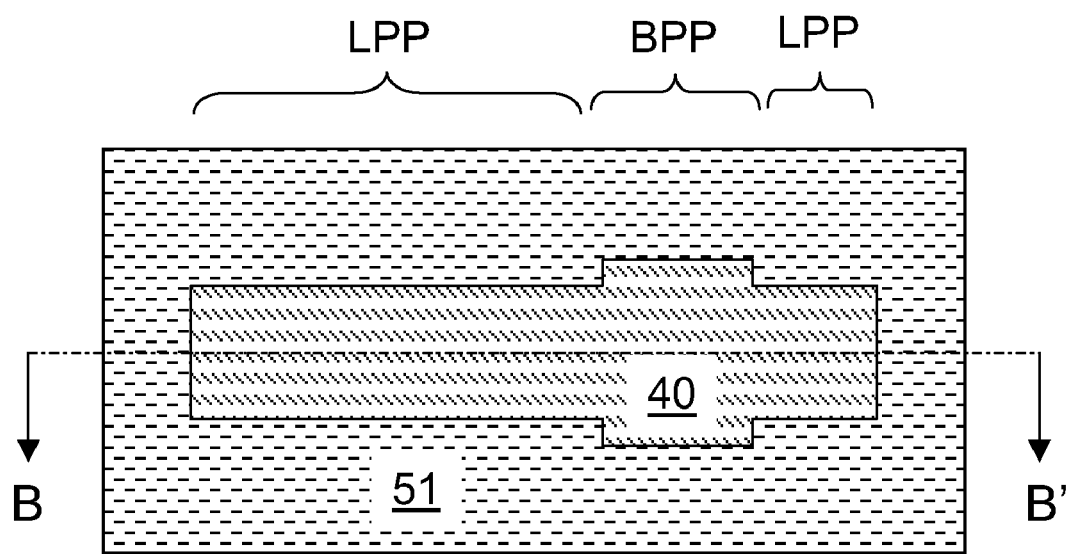
Figure 2B:
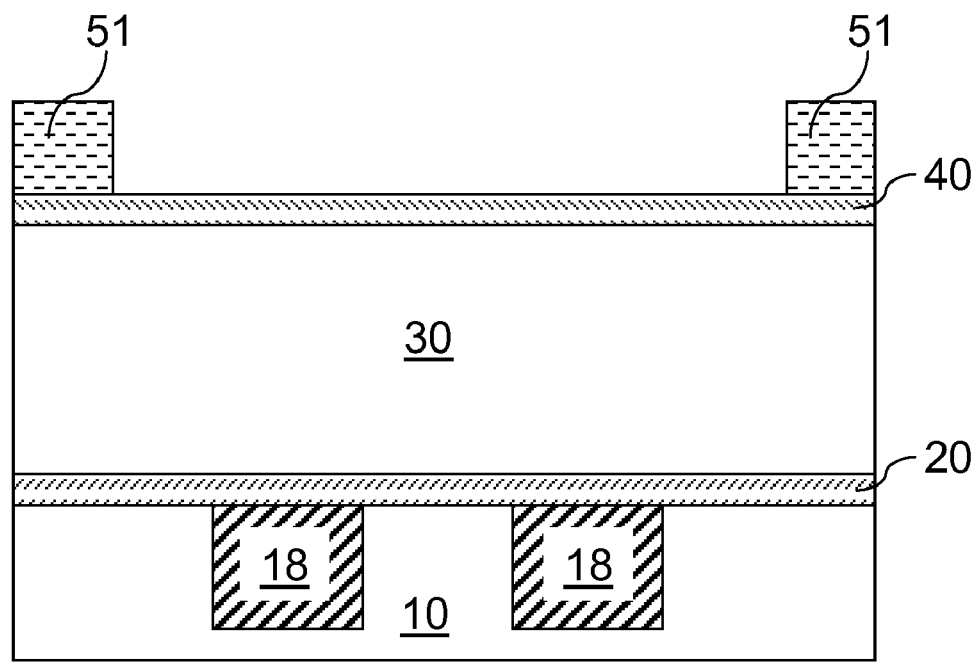

Referring to FIGS. 2A and 2B, the pattern in the photoresist 61 is transferred into the hard mask layer 51 located underneath by an anisotropic etch such as a reactive ion etch. The anisotropic etch is preferably selective to the planarization stopping layer 40. The exposed portion of the hard mask layer 40 within the pattern in the photoresist 61 is removed, and a top surface of the planarization stopping layer 40 is exposed within the pattern formed in the hard mask layer 51. The pattern in the hard mask layer 51 and the pattern in the photoresist 61 are substantially identical. The photoresist 61 is subsequently removed selectively to the hard mask layer 51 and the planarization stopping layer 40, for example, by ashing. A suitable clean may be performed at this step. The pattern in the hard mask layer 51 forms a recessed region in which a top surface of the planarization stopping layer 40 is exposed.

Figure 3A:
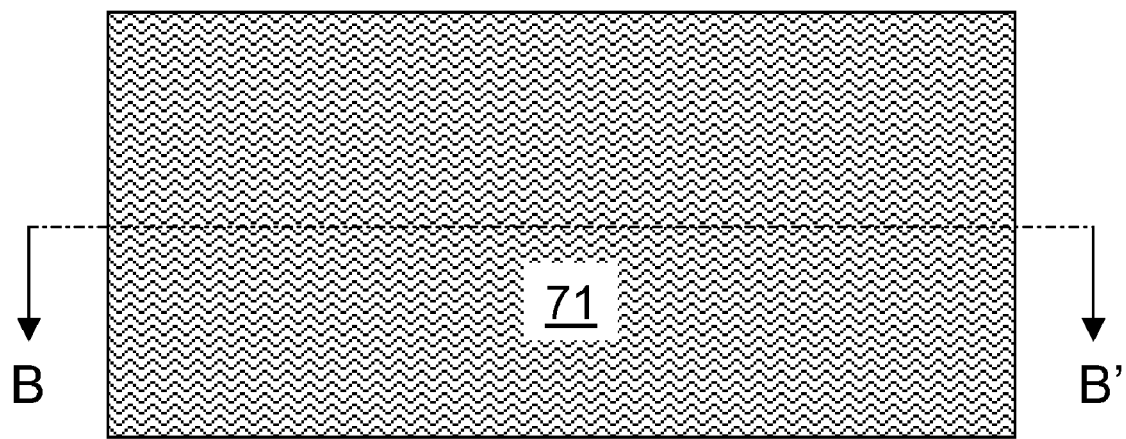
Figure 3B:
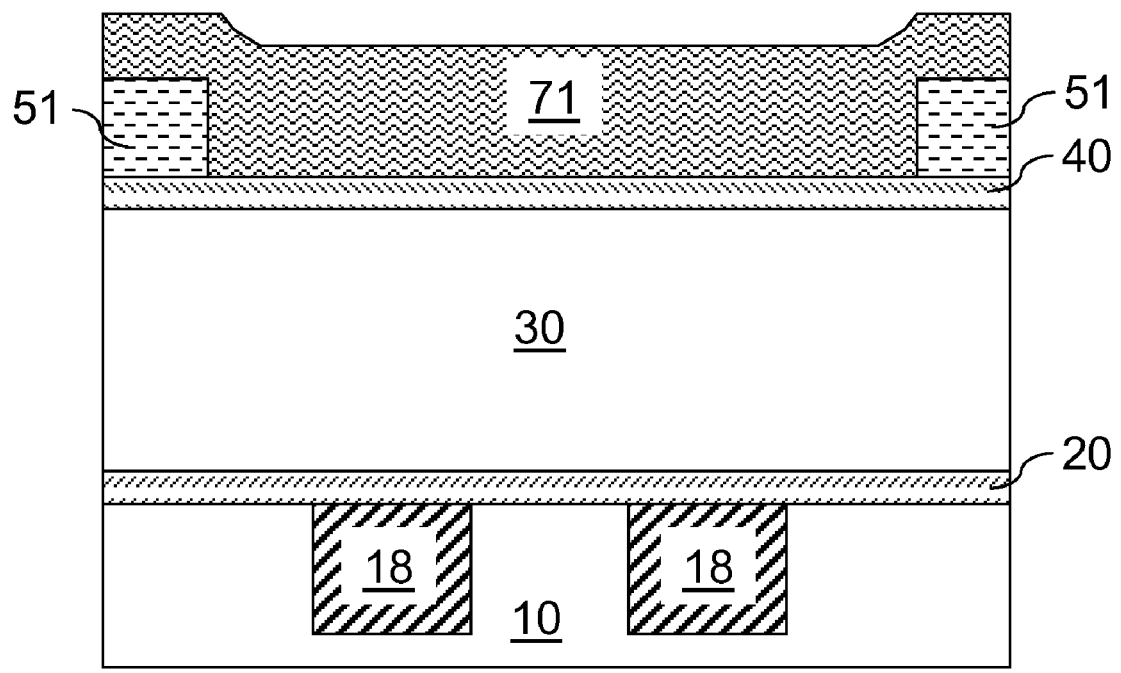

Referring to FIGS. 3A and 3B, a block copolymer layer 71 comprising self-assembling block copolymers that are capable of self-organizing into nanometer-scale patterns are applied over the exemplary metal interconnect structure including the recessed region. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools).

Exemplary materials for the block copolymer layer 71 are described in commonly-assigned, copending U.S. patent application Ser. Nos. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the exemplary metal interconnect structure to form a block copolymer layer 71. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. Preferably, the thickness of the block copolymer layer 71 is greater than the thickness of the hard mask layer 51.

Figure 4A:
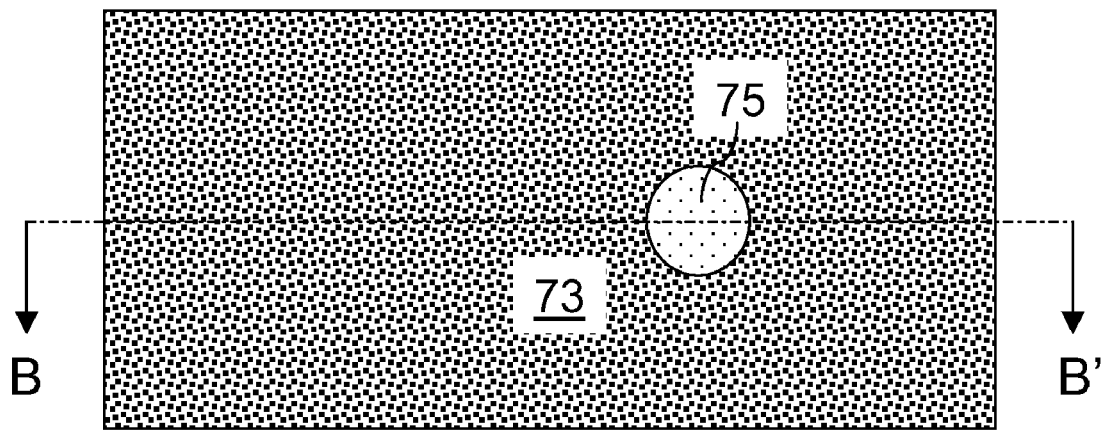
Figure 4B:
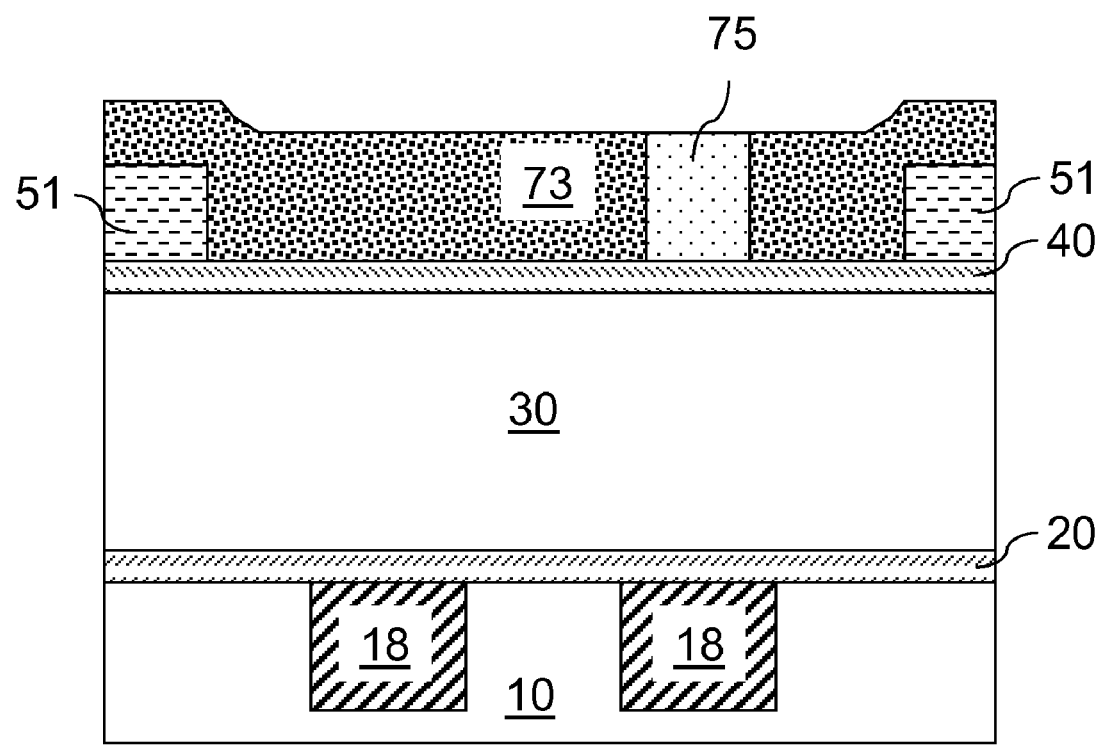

Referring to FIGS. 4A and 4B, the exemplary metal interconnect structure is annealed at an elevated temperature to form a cylindrical polymeric block 75 and a polymeric block matrix 73. Exemplary processes of annealing the self-assembling block copolymers in the block copolymer layer 71 to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Further, methods of annealing described in the '963 application may be employed. The anneal may be performed, for example, at a temperature from about 200° C. to about 300° C. for a duration from less than about 1 hour to about 100 hours.

The anneal induces self-aligned separation of a first polymeric block component, which constitutes the cylindrical polymeric block 75, and a second polymeric block component, which constitutes the polymeric block matrix 73. The first polymeric block component and the second polymeric block component are immiscible with each other, and thus, separate into the two distinct structures, i.e., the cylindrical polymeric block 75 and the polymeric block component upon the anneal.

Preferably, the cylindrical polymeric block 75 is formed only in the bulge pattern portion BPP (See FIG. 1A), and is not formed in the line pattern portion LPP or outside the recessed region, i.e., over the hard mask layer 51. Such geometrical features may be effected by optimizing the viscosity and the surface tension of the first and second polymeric block components, the percentage composition of the first and second polymeric block components within the block copolymer layer 71 and the thickness of the block copolymer layer 71, as well as the molecular weight of the block polymers. The thickness of the block copolymer layer 71 may be greater than the thickness of the hard mask layer 51 so that the block copolymer layer 71 covers the entirety of the recessed region and the hard mask layer 51. The thickness of the block copolymer layer 71 over the hard mask layer 51 is set to avoid formation of any cylindrical polymeric block 75 above the hard mask layer 51. Alternately, the thickness of the block copolymer layer 71 may be set to be less than the thickness of the hard mask layer 51 so that the block copolymer layer 71 is present only in the recessed region comprising the line pattern portion LPP and the bulge pattern portion.

The cylindrical polymeric block 75 has a form of an elliptical cylinder having a major axis in the direction of the second width W2 (See FIG. 1A), or in the direction perpendicular to the second width W2, i.e., in the direction parallel to the second length L2. The polymeric block matrix 73 laterally abuts and surrounds the cylindrical polymeric block 75. The dimensions of the cylindrical polymeric block 75 may, or may not be sublithographic. In one embodiment, a minor diameter of the cylindrical polymeric block 75, which is the minor diameter of the ellipse in a horizontal cross-section of the cylindrical polymeric block 75, is sublithographic. In another embodiment, a major diameter of the cylindrical polymeric block 75, which is the major diameter of the ellipse in a horizontal cross-section of the cylindrical polymeric block 75, is also sublithographic.

The cylindrical polymeric block 75 is self-aligned to the center of the bulge pattern portion BPP (See FIG. 2A) in the pattern of the hard mask layer 51. This is because the surface tension of the material in the self-assembling block copolymers determines the location of the center of the cylindrical polymeric block 75. This is particularly so when the protrusions of the bulge pattern portion BPP are symmetric, i.e., when the bulge pattern portion BPP protrudes from sidewalls of the line portion BP by an equal distance on both sides of the bulge pattern portion BPP.

Figure 5A:
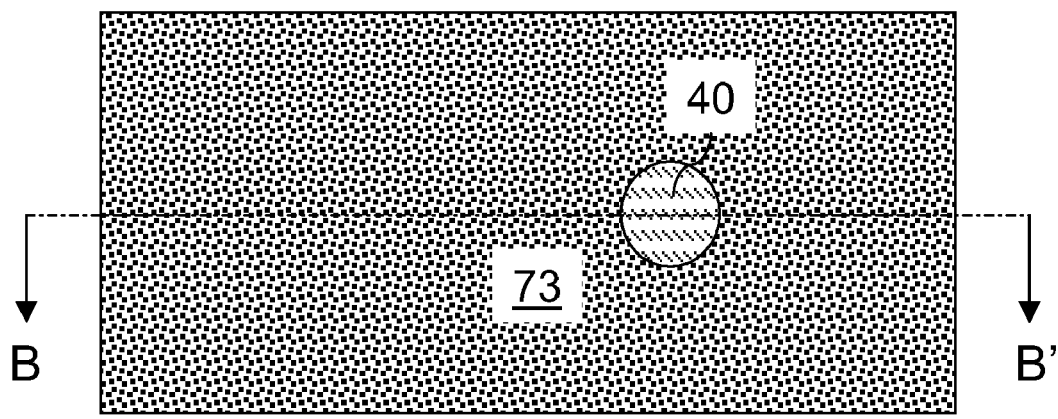
Figure 5B:
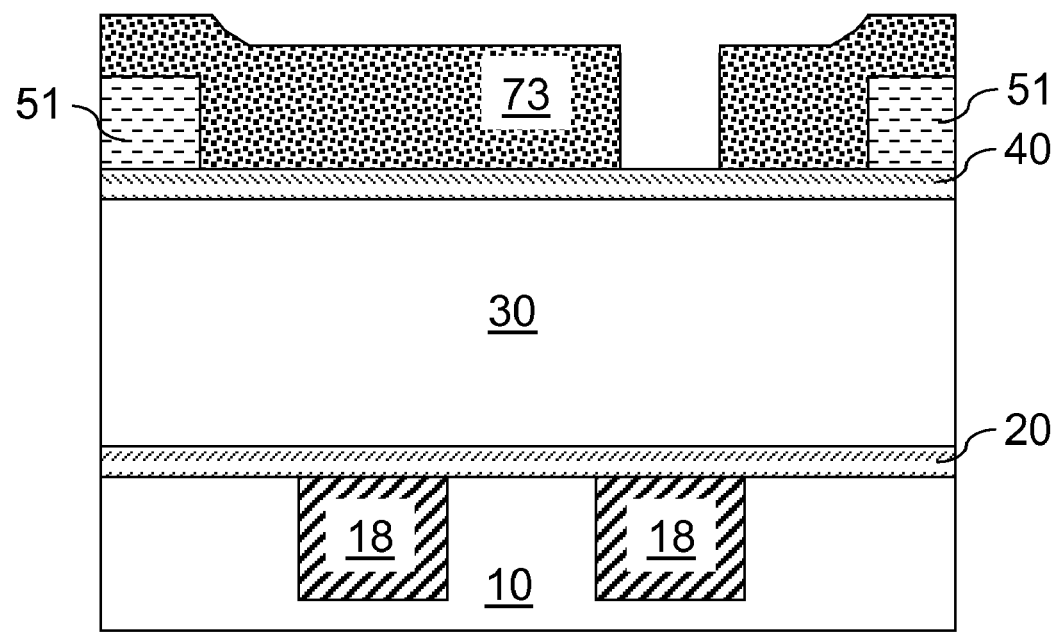

Referring to FIGS. 5A and 5B, the cylindrical polymeric block 75 is removed selective to the polymeric block matrix 73 by an etch, which may be a dry etch or a wet etch. The etch may be an isotropic etch or an anisotropic etch. The etch selectively removes the first polymeric block component selective to the second polymeric block component. The etch may, or may not, be selective to the planarization stopping layer 40. A cylindrical cavity is formed in the volume from which the cylindrical polymeric block 75 is removed. The cylindrical cavity is laterally surrounded by the cylindrical polymeric block 75, and a top surface of the planarization stopping layer 40 is exposed within the cylindrical cavity.

Figure 6A:
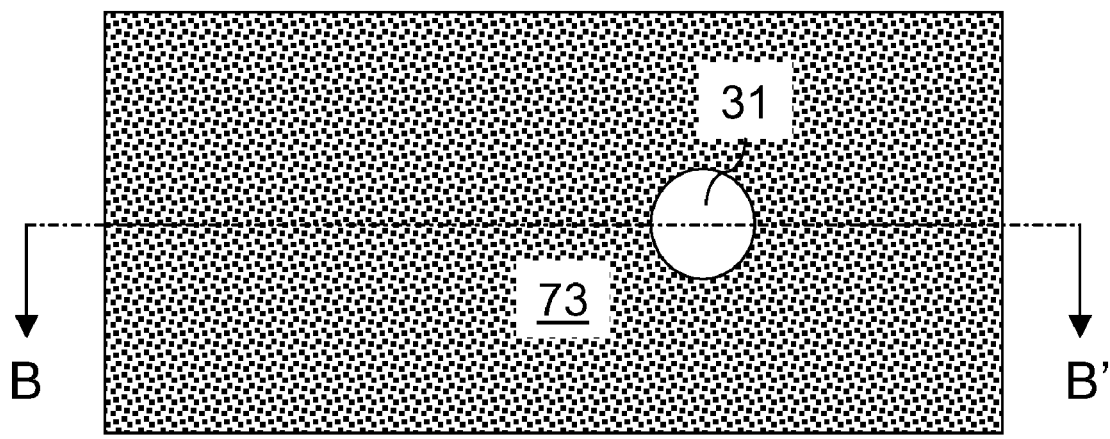
Figure 6B:
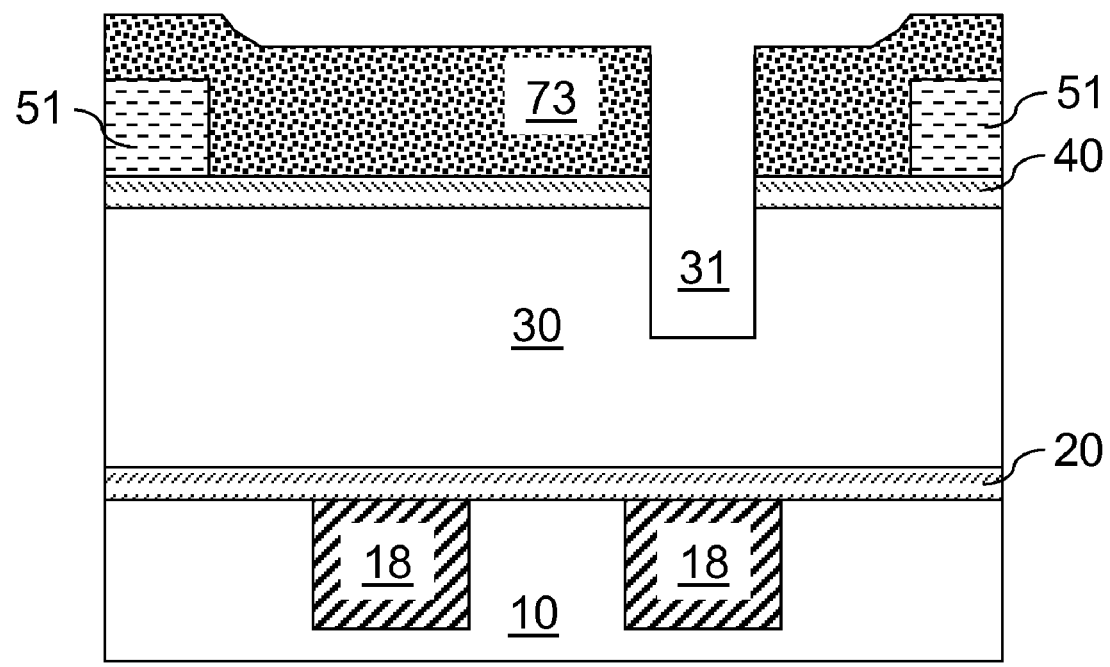

Referring to FIGS. 6A and 6B, the pattern of the cylindrical cavity is transferred through the planarization stopping layer 40 and into the dielectric layer 30 by an anisotropic etch employing the polymeric block matrix 73 as an etch mask. A via cavity 31 having substantially the same horizontal cross-sectional area as the cylindrical cavity is formed within the dielectric layer 30. The via cavity 31 may, or may not, extend to a bottom surface of the dielectric layer 30. For the purposes of description of the present invention, an embodiment is illustrated in which the via cavity 31 does not extend to a bottom surface of the dielectric layer 30, i.e., a bottom surface of the via cavity 31 is located midway between a top surface and a bottom surface of the dielectric layer 31. However, embodiments in which the via cavity 31 extends to a bottom surface of the dielectric layer 30, i.e., to a top surface of the dielectric cap layer 20, is contemplated herein also.

Figure 7A:
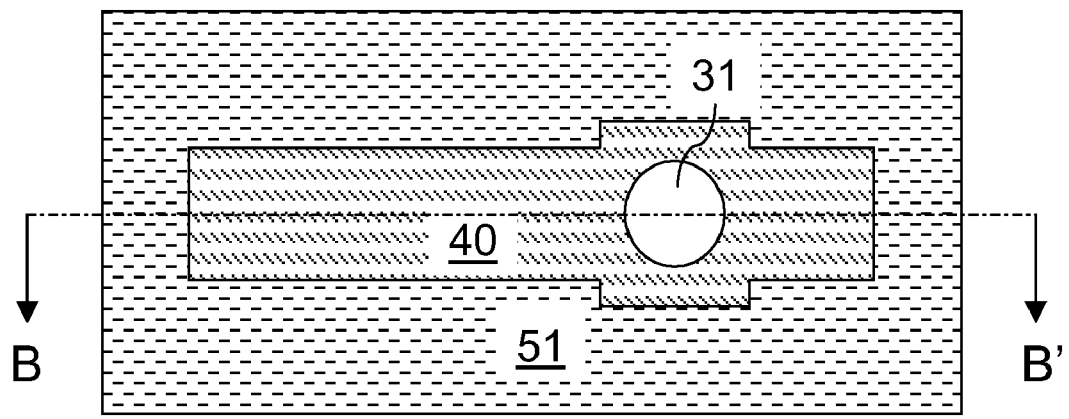
Figure 7B:
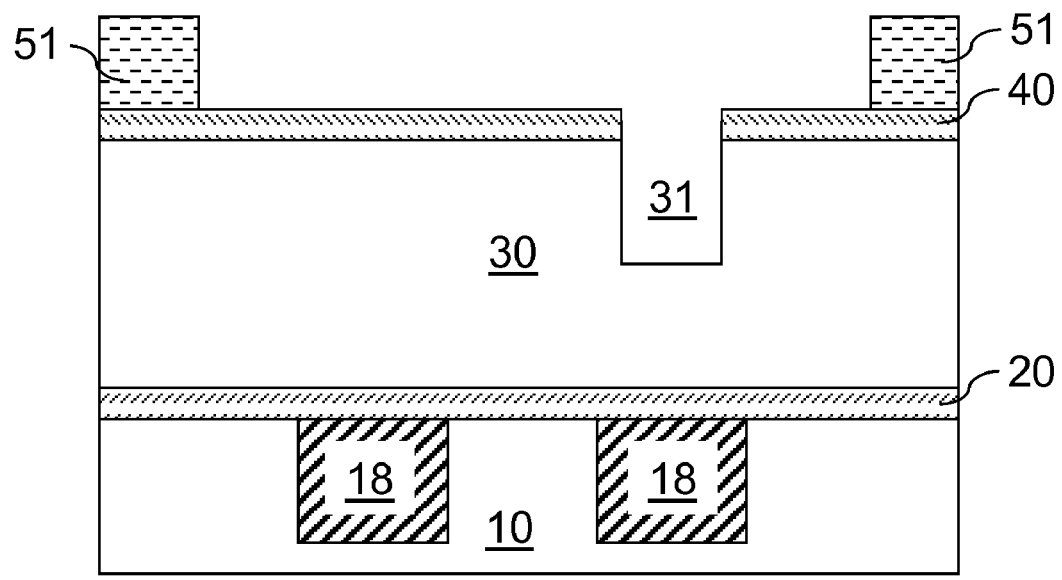

Referring to FIGS. 7A and 7B, the polymeric block matrix 73 is removed selective to the hard mask layer 51 and at least one of the planarization stopping layer 40 and the dielectric layer 30. Preferably, the etch process employed to remove the polymeric block matrix 73 is selective to the planarization stopping layer.

Figure 8A:
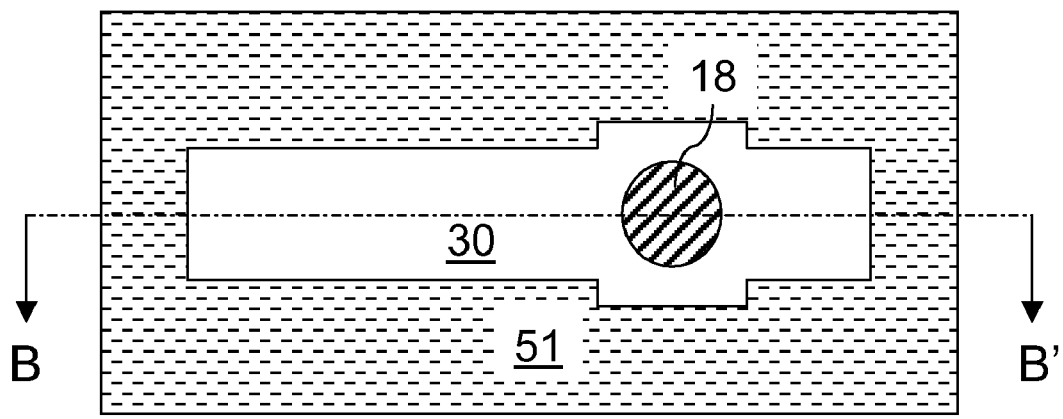
Figure 8B:
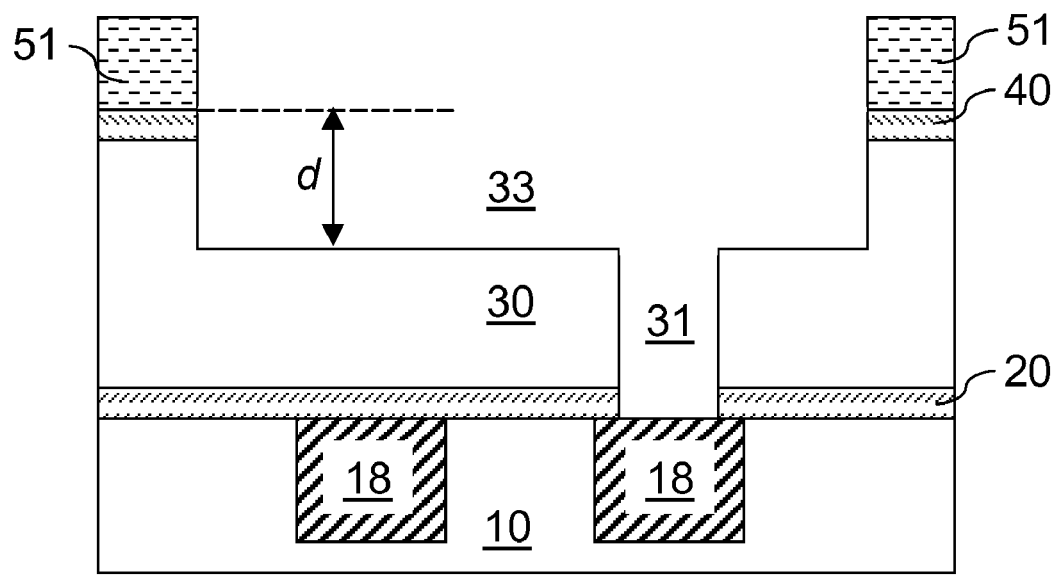

Referring to FIGS. 8A and 8B, the pattern in the hard mask layer 51 is transferred into the dielectric layer 30 by an anisotropic etch to form a line cavity 33, which has substantially the same geometric characteristics as the pattern in the photoresist 61 as shown in FIG. 1A. The depth d of the line cavity 33, as measured from a top surface of the planarization stopping layer 40 to a bottom surface of the line cavity 33, is determined by the desired height of a metal line to be subsequently formed. During the etching of the line cavity 33, the via cavity 31 is deepened to reach a top surface of the dielectric cap layer 20, if not already exposed. The exposed portion of the dielectric cap layer 20 is then etched during the anisotropic etch to expose a top surface of the underlying conductive structures 18, which may comprise at least one metal line, at least one metal via, or any other conductive structure or a semiconductor device. The line cavity 33 directly overlies an entirety of the via cavity 31. The via cavity 31 is self-aligned to the line cavity 33 since the cylindrical cavity, underneath which the via cavity 31 is formed, is self-aligned to the polymeric block matrix 73, of which the pattern is transferred into the dielectric layer 30 to form the line cavity 33.

Figure 9A:
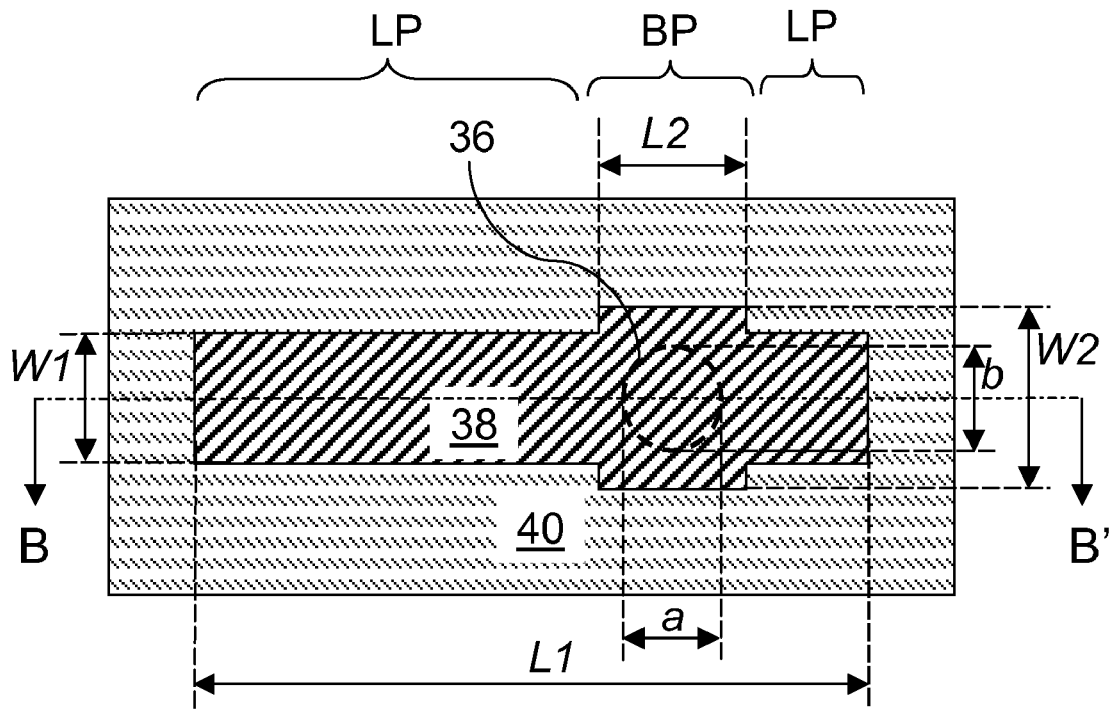
" In FIG. 9A, a cross-sectional area for a metal via 36 is represented by a dotted line.
Figure 9B:
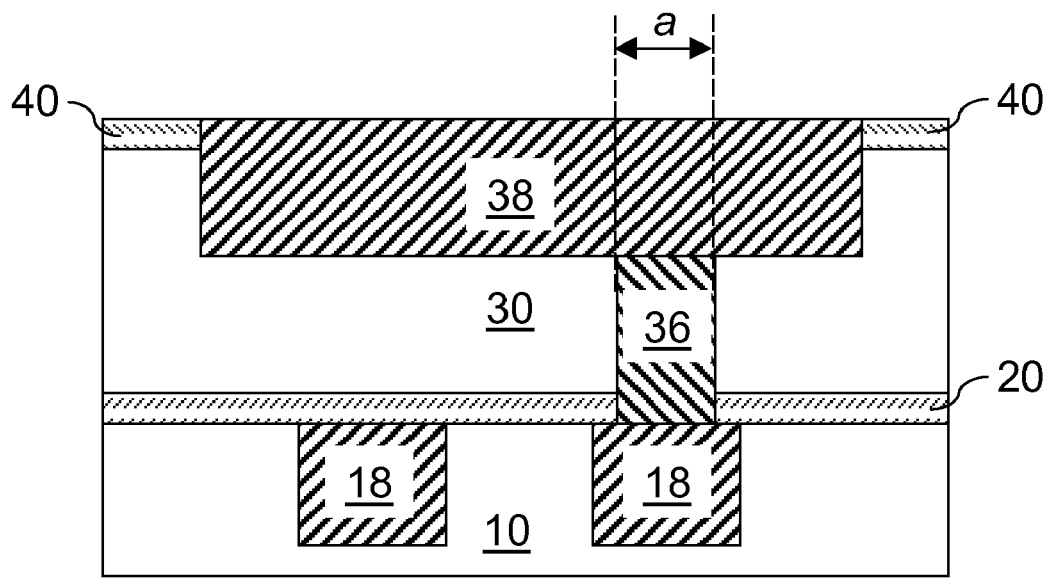

Referring to FIGS. 9A and 9B, the hard mask layer 51 is removed selective to the planarization stopping layer 40 and the dielectric layer 30. The etch process employed to removed the hard mask layer 51 may be isotropic or anisotropic, and may be a dry etch or a wet etch.

Preferably, a metallic barrier layer (not shown) is formed to prevent diffusion of contaminants from and/or into a metal via and a metal line to be subsequently formed, as well as to promote adhesion of the metal via and the metal line to the dielectric layer 30. The metallic barrier layer may comprise Ta, TaN, W, WN, TiN, or a stack thereof such as Ta/TaN, Ta/TaN/Ta, TaN/Ta, etc.

Preferably, a metal seed layer (not shown) may be formed on the metallic barrier layer, for example, by physical vapor deposition (PVD), chemical vapor deposition (CVD), atomic layer deposition (ALD), electrodeposition, or electroless deposition. Preferably, the metal seed layer may comprise the same material to be subsequently deposited by electroplating or an alloy thereof. For example, the metal seed layer may comprise copper.

A metal, such as copper, is electroplated to form a metal layer (not shown). Preferably, the metal is electroplated employing a superfill process, in which a deposition rate of the metal is higher on a bottom surface than on a sidewall surface, so that seams or cavities are eliminated within the metal layer. The metal layer is plated with sufficient overburden such that all volume beneath the top surface of the planarization stopping layer 40 is filled with the metal layer. Alternately, the metal layer may be formed by chemical vapor deposition (CVD) of the metal.

The metal layer is planarized, for example, by chemical mechanical planarization (CMP) processing step. In this case, the planarization stopping layer 40 may be employed as a stopping layer during the CMP processing step so that removal of the metal from the metal layer stops when a top surface of the remaining portion of the metal layer becomes substantially coplanar with a top surface of the planarization stopping layer 40.

The remaining portions of the metal layer constitute a metal line 38 and a metal via 36. Specifically, the remaining portion of the metal layer filling the via cavity 31 (See FIG. 8B) constitutes the metal via 36, and the remaining portion of the metal layer filling the line cavity 33 constitutes the metal line 38. The metal line 36 comprises a line portion LP and a bulge portion BP, which have similar geometrical features as the line pattern portion LLP and the bulge pattern portion BPP in FIG. 1A. Specifically, each segment of the line portion LP has the first width W1, and the bulge portion BP has the second width W2. The bulge portion BP may have a rectangular area, and each segment of the line portion LP may have a rectangular area. The total length of the line portion LP and the bulge portion BP is the first length L1. In case the bulge portion BP has a rectangular area, the length of the bulge portion BP is the second length L2.

The metal via 36 has an elliptical horizontal cross-sectional area, i.e., the cross-sectional area of the metal via 36 is an ellipse. The ellipse has a first diameter a in the direction parallel to the second length L2, and a second diameter b in the direction parallel to the second width W2. The first diameter a may be the major diameter of the ellipse, and the second diameter b may be the minor diameter of the ellipse. Alternately, the first diameter a may be the minor diameter of the ellipse, and the second diameter b may be the major diameter of the ellipse. The first diameter a and the second diameter b may, or may not, be the same.

The exemplary metal interconnect structure of the present invention does not have any overlay variation between the metal line 38 and the metal via 36, i.e., the overlay between the metal line 38 and the metal via 36 is substantially equal to zero, since the metal via 36 is self-aligned to the metal line 38. This is effected by designing the area for the bulge portion BP such that the center of the bulge portion BP coincides with an intended location of the metal via 36. Elimination of overlay variations between the metal via 36 and the metal line 38 results in advantageous effects of enhancement in yield, performance, and/or reliability of the inventive metal interconnect structure.

Further, formation of the metal line 38 and the metal via 36 employ one lithographic step. In comparison with conventional integration schemes that employ two lithographic steps, i.e., one lithographic step for forming a line pattern and another lithographic step for forming a via pattern, one lithographic processing step is eliminated, which results in savings in the manufacturing cost.

Yet further, the metal vias 36 may have sublithographic dimensions. This is effected by selecting the composition of the self-assembling block copolymers so that the dimensions of the cylindrical polymeric block 75 (See FIGS. 4A and 4B) has a sublithographic dimension. In one embodiment, the minor diameter may be a sublithographic dimension. In another embodiment, both the minor diameter and the major diameter may be a sublithographic dimension. Such sublithographic dimensions enable wiring of fine features underneath without causing electrical shorts therebetween, and consequently enable a high density wiring in the inventive metal interconnect structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a metal interconnect structure comprising:
    forming a hard mask layer over a dielectric layer;
    patterning said hard mask layer to form a recessed region comprising a first portion and a second portion, wherein said first portion has a first width between a first pair of parallel edges and said second portion has a second width between a second pair of parallel edges, and wherein said first pair of parallel edges is parallel to said second pair of parallel edges and said second width is greater than said first width;
    applying self-assembling block copolymers within said recessed region;
    annealing said self-assembling block copolymers and inducing formation of a cylindrical polymeric block and a polymeric block matrix surrounding said cylindrical polymeric block;
    removing said cylindrical polymeric block selective to said polymeric block matrix; and
    forming a via cavity in said dielectric layer by etching said dielectric layer employing said polymeric block matrix as an etch mask.

2. The method of claim 1, wherein said self-assembling block copolymers contains a first polymeric block component and a second polymeric block component that are immiscible with each other.

3. The method of claim 2, wherein said cylindrical polymeric block comprising said first polymeric block component and said polymeric block matrix comprises said second polymeric block component.

4. The method of claim 1, wherein said self-assembling block copolymers comprises at least one of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

5. The method of claim 1, further comprising forming a line cavity in said dielectric layer by transferring a pattern of said recessed region into said dielectric layer.

6. The method of claim 5, wherein said line cavity is formed by an etch that removes said dielectric layer employing said hard mask layer as an etch mask.

7. The method of claim 5, further comprising deepening said via cavity during said formation of said line cavity, wherein a conductive structure is exposed at a bottom of said via cavity after said deepening of said via cavity.

8. The method of claim 5, further comprising:
depositing metal in said via cavity and said line cavity; and
planarizing said metal, wherein a remaining portion of said metal in said via cavity constitutes a metal via and a remaining portion of said metal in said line cavity constitutes a metal line.

9. The method of claim 1, wherein said via cavity is self-aligned to a center of said second portion.

10. The method of claim 1, wherein said via cavity has a form of an elliptical cylinder.

11. The method of claim 10, wherein said first width is a lithographic dimension, and wherein a minor diameter of said elliptical cylinder is a sublithographic dimension.

12. The method of claim 11, wherein a major diameter of said elliptical cylinder is a sublithographic dimension.

13. The method of claim 1, further comprising forming a dielectric oxide layer directly on said dielectric layer, wherein said hard mask layer is formed directly on said dielectric oxide layer and comprises silicon nitride.

* * * * *